United States Patent
Jang

(10) Patent No.: US 7,504,278 B2
(45) Date of Patent: Mar. 17, 2009

(54) IMAGE SENSOR AND METHOD FOR MANUFACTURING THE SAME

(75) Inventor: James Jang, Cheongju-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 268 days.

(21) Appl. No.: 11/433,563

(22) Filed: May 15, 2006

(65) Prior Publication Data

US 2006/0223212 A1 Oct. 5, 2006

Related U.S. Application Data

(62) Division of application No. 10/747,057, filed on Dec. 30, 2003, now Pat. No. 7,071,501.

(30) Foreign Application Priority Data

Sep. 30, 2003 (KR) .................. 10-2003-0067972

(51) Int. Cl.
*H01L 21/00* (2006.01)
(52) U.S. Cl. .................. 438/57; 438/59; 438/60; 438/64; 438/65; 438/66; 438/73; 438/74; 438/75; 438/76; 438/77; 438/78; 438/90; 438/275; 438/276
(58) Field of Classification Search .......... 438/57, 438/59–60, 64–66, 73–78, 90, 275–276
See application file for complete search history.

(56) References Cited

U.S. PATENT DOCUMENTS

| | | | |
|---|---|---|---|
| 6,486,521 B2 * | 11/2002 | Zhao et al. | ........ 257/443 |
| 6,900,480 B2 | 5/2005 | Sugiyama | |
| 2002/0075390 A1 | 6/2002 | Muramatsu et al. | |
| 2003/0127666 A1 | 7/2003 | Lee | |
| 2004/0141077 A1 * | 7/2004 | Ohkawa | ........ 348/308 |

* cited by examiner

*Primary Examiner*—Zandra Smith
*Assistant Examiner*—Bac H Au
(74) *Attorney, Agent, or Firm*—Finnegan, Henderson, Farabow, Garrett & Dunner, L.L.P.

(57) ABSTRACT

An image sensor is disclosed where individual photo diodes of the respective unit cells separated by an element isolating layer are physically integrated into a single large scale pixel formed widely on a semiconductor substrate so as to hold the pixels in common. A pixel separation pattern is additionally formed on a portion of the large scale photo diode formed so as to electrically separate them. An optimization of the light receiving area of the photo diode, a minimization of the intrusion area of an element isolating layer, and so on are achieved, so that the photo diode recovers an area occupied by an intrusion of the element isolating layer, thus maximizing the light receiving area in an optimal scale and easily preventing electrical impacts between the respective unit cells.

20 Claims, 8 Drawing Sheets

IMAGE SENSOR AND METHOD FOR MANUFACTURING THE SAME

This application is a divisional of application Ser. No. 10/747,057, filed Dec. 30, 2003, now U.S. Pat. No. 7,071,501, which is based upon and claims the benefit of priority from Korean Patent Application No. 10-2003-0067972, filed on Sep. 30, 2003. The entire contents of these applications are incorporated herein by reference.

BACKGROUND OF THE INVENTION

1. Field of the Invention

The present invention relates to an image sensor, and more particularly, to an image sensor and a method for manufacturing the same, in which a maximization of a light receiving area of a photo diode and a minimization in a scale of formation of an element isolating region result from an improvement of a layout of the photo diode.

2. Description of the Related Art

Recently, with a rapid development of the electric/electronic technologies, various electronics, such as video cameras, digital still cameras, minicams adapted personal computers (PC), minicams adapted for mobile phones, and so forth, employing image sensor technologies have been widely developed and used.

Traditionally, as a conventional image sensor as described above, charge coupled devices (CCDs) have been generally used. However, such CCDs have drawbacks in high driving voltages, requiring separate additional support circuits, and having high per-unit prices, so that the usage thereof has been declining.

Recently, as an image sensor for overcoming the disadvantages of the CCD, attention is being focused on Complementary Metal Oxide Semiconductor (CMOS) image sensors. Since the CMOS image sensors are manufactured based on a series of CMOS circuit technologies, contrary to the existing CCD, they have advantages which include low driving voltages, obviating additional support circuits, low per-unit prices, etc.

Under such conventional technology systems, as shown in FIG. 1, unit cells C1, C2, C3 and C4 of the CMOS image sensor may be arranged together on a semiconductor substrate, forming a series of cell groups C.

Herein, respective unit cells C1, C2, C3 and C4 may have a construction including a combination of, for example, a photo diode (PD), a reset transistor (Rx), a drive transistor (Dx) and a select transistor (Sx). A region of the photo diode, an active region around a reset gate electrode 2, an active region around a drive gate electrode 3, an active region around a select gate electrode 4 and so forth are lightly or heavily doped with impurity ions, and around the respective unit cell C1, C2, C3 and C4, an element isolating layer 6 is formed to electrically separate the corresponding unit cells from each other.

Herein, the photo diode serves to generate and store a certain level of an electron-hole pair through receiving light incident from exterior. The reset transistor (Rx) may serve to reset the electron-hole pair generated and stored by the photo diode PD to its initial state. The drive transistor Dx may serve as a source follower buffer amplifier. Finally, the select transistor Sx may serve as a switching device and an addressing device.

In the conventional CMOS image sensor having such construction, as described above, the element isolating layer 6 may be formed around the respective unit cells C1, C2, C3 and C4 so as to electrically separate the corresponding unit cells C1, C2, C3 and C4. In this case, the occupying area of the photo diode PD is typically greatly reduced in proportion to the occupying area of the element isolating layer 6, so that the fill factor of the photo diode may be greatly reduced.

In case that the occupying area of the photo diode PD is greatly reduced by occupying area of the element isolating layer 6, resulting in a reduction of the fill factor of the photo diode, the quantity of light the photo diode PD can receive from the exterior may also be greatly reduced, thus greatly reducing the quality of the finished CMOS image sensor.

Meanwhile, under the conventional systems, for forming the element isolating layer 6, an etching process for a semiconductor substrate is typically performed, so that the semiconductor substrate is typically damaged by mechanical/chemical shocks applied during the etching process. In this case, when the photo diode PD is formed on an active region of the semiconductor substrate defined by the isolating layer 6 without any separate mitigating steps, a series of phenomena of current leakage due to the above damages is typically generated at interfaces L1, L2, L3 and L4 between the element isolating layer 6 and the photo diode.

When the current leakage between the element isolating layer 6 and the photo diode PD continues due to the damage of the semiconductor substrate caused by etching the element isolating layer 6, the electron-hole pair generated by the photo diode PD can not be conducted normally, which greatly reduces the quality of the finished CMOS image sensor.

Of course, if the occupying area of the photo diode PD is greatly reduced, the problems of reduction in the fill factor of the photo diode PD due to an intrusion of the element isolating layer 6, and the generation of current leakage at the interfaces L1, L2, L3 and L4 between the element isolating layer 6 and the photo diode PD, can be greatly reduced. However, in this case, electrical impacts between unit cells are typically inevitable, so that, in conventional sensors, a solution to address the problems caused by the serious defects generated by the element isolating layer 6 is desired.

SUMMARY OF THE INVENTION

Accordingly, embodiments consistent with the present invention have been made to solve the above-mentioned problems occurring in conventional sensors, and an aspect of an embodiment of the present invention is to physically integrate individual photo diodes of the respective unit cells separated by an element isolating layer into a single large scale pixel formed widely on a semiconductor substrate so as to hold the pixel in common, to additionally form_a pixel separation pattern on a portion of the large scale photo diode formed like above so as to electrically separate the same, and to naturally secure an optimization of the light receiving area of the photo diode, a minimization of the intrusion area of an element isolating layer and so on, so that the photo diode recovers an area occupied by an intrusion of the element isolating layer, thus maximizing the light receiving area in an optimal scale and easily preventing electrical impacts between the respective unit cells.

Another aspect of an embodiment of the present invention is to improve the quality of a finished CMOS image sensor above a certain level by inducing the maximization of the light receiving area of a photo diode through an improvement of layouts of the photo diodes to greatly increase the fill factor of the corresponding photo diode and thus to increase the quantity of light the photo diode can receive.

An additional aspect of an embodiment of the present invention is to improve the quality of a finished CMOS image sensor above a certain level by inducing a minimization of formation of an element isolating layer through an addition of a pixel separation pattern, for electrically separating a photo diode integrated into a single large scale pixel to naturally minimize a damaged ratio of a semiconductor substrate caused by a formation of the element isolating layer, and thus to restrict a phenomenon of current leakage generated at the interfaces between the element isolating layer and the photo diode at the minimum.

In order to accomplish these aspects, an image sensor is provided which may comprise a photo diode formed on an active region of a semiconductor substrate, wherein the photo diode may consist of a plurality of pixels and may be formed by integrating the pixels into one pixel without being separated by an element isolating layer; a pixel separation pattern may be formed on the photo diode and selectively driven depending upon input voltage, thus defining the photo diode into unit pixels; and transistors for individually resetting the respective unit pixels defined by the pixel separation pattern and individually transferring electron-hole pair may be stored in the respective unit pixels.

Herein, the pixel separation pattern may consist of a first pattern for vertically separating the photo diode and a second pattern for horizontally separating the photo diode. Herein, the first pattern and the second pattern may be electrically connected to or insulated from each other.

According to another aspect of the present invention, a method for manufacturing an image sensor is provided which may comprise forming a plurality of pixels into one group without being separated by an element isolating layer so as to form a photo diode on an active region defined on a semiconductor substrate, the plural pixels constituting the photo diode; forming a pixel separation pattern on the semiconductor substrate for electrically separating the photo diode; and forming transistors on the semiconductor substrate so as to control the pixels constituting the photo diode electrically separated by the pixel separation pattern.

In this case, the pixel separation pattern may be composed of poly silicon material.

BRIEF DESCRIPTION OF THE DRAWINGS

The above and other features and advantages of the present invention will be more apparent from the following detailed description taken in conjunction with the accompanying drawings, in which.

DETAILED DESCRIPTION OF THE EMBODIMENTS

Figure 1:
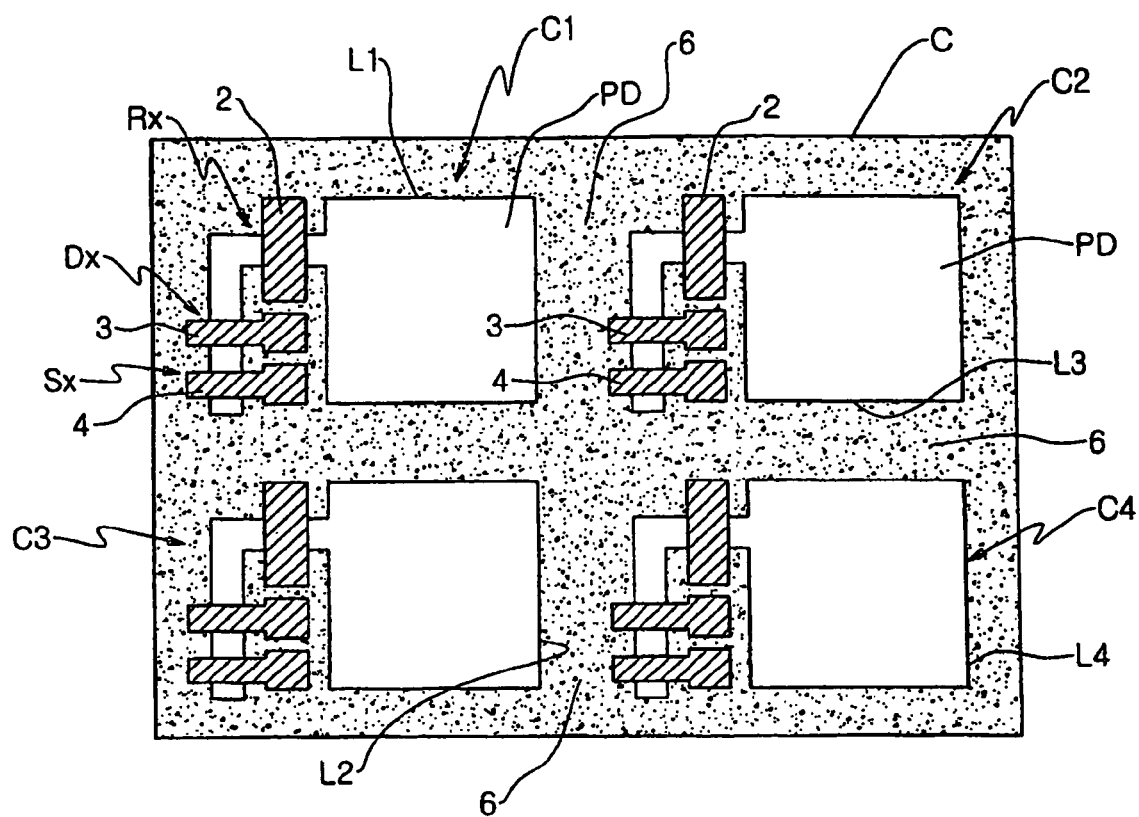
FIG. 1 shows a cell group of unit cells of a conventional image sensor.

Hereinafter, embodiments of the present invention will be described with reference to the accompanying drawings. In the following description and drawings, the same reference numerals are used to designate the same or similar components, and so repetition of the description of the same or similar components will be omitted.

Figure 2:
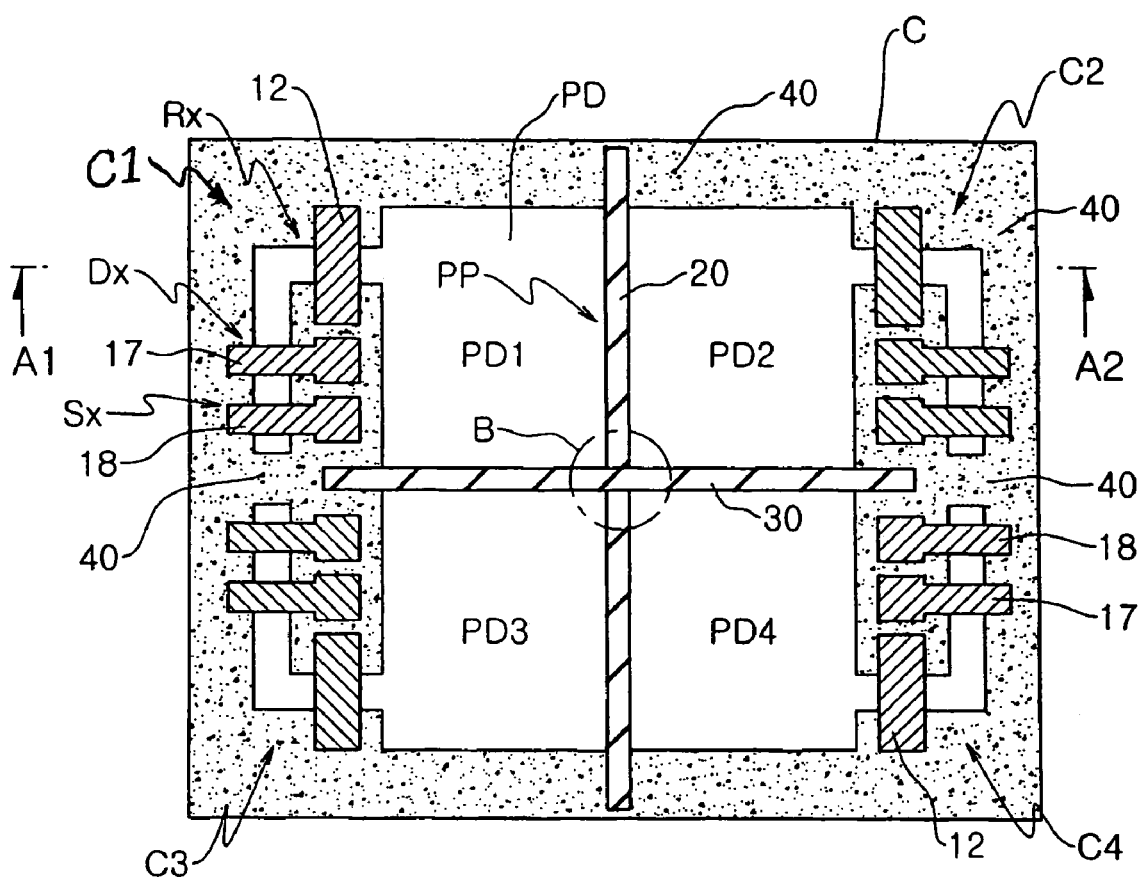
FIG. 2 shows a cell group of unit cells of an image sensor consistent with embodiments of the present invention.

As shown in FIG. 2, in the image sensor according to an embodiment consistent with the present invention, unit cells C1, C2, C3 and C4 placed adjacent to each other to constitute a cell group C which may be physically integrated into one cell without an interference of an element isolating layer 40 in such a manner that they may hold a large scale single photo diode PD in common. The single photo diode may be formed by integrating unit pixels PD1, PD2, PD3 and PD4 into one. In this case, the photo diode PD has a construction in which a plurality of pixels, each forming a single photo diode, may constitute one on an active region of a semiconductor substrate without being separated by the element isolating layer.

Herein, the number of the unit cells that can hold the photo diode PD in common may be gradually increased, such as 5, 6, . . . and so on, or decreased, such as 3, 2 and so on.

Such structure holding the photo diode in common is one characteristic of an embodiment of the present invention.

As shown in FIG. 1, under a conventional system, since a photo diode placed to the respective unit cells may be divided by an element isolating layer, thus being separated physically, as long as a separate measure is not performed, the individual photo diodes placed to the respective unit cells are typically intruded in a certain portion of an available area of the semiconductor substrate by the element isolating layer. Thus, its occupying area may be restricted in a certain level.

However, as is mentioned before, in the embodiment, since the photo diode PD held in common by the respective unit cells C1, C2, C3 and C4 may be physically integrated into one without an interference of the element isolating layer 40, the photo diode PD may naturally recover the available area of the semiconductor substrate intruded by the element isolating layer 40, thus maximizing its occupying area suitably.

Of course, when the photo diode PD held in common by the unit cells C1, C2, C3 and C4 recovers the available area of the semiconductor substrate to optimally increase its rate of light receiving and the fill factor, etc., the quantity of light that can be treated by the cell group C consisting of the unit cells C1, C2, C3 and C4 can be greatly increased, thus considerably improving the quality of a finished CMOS image sensor.

Meanwhile, in the embodiment, as mentioned before since the photo diode PD held in common by the respective unit cells C1, C2, C3 and C4 may be physically integrated into one without an interference of the element isolating layer 40, if the photo diode PD is continued to be operated without a separate measure, it may cause a problem in that the electrical relationship among the unit cells C1, C2, C3 and C4 being indistinct.

In consideration of the above problem, proposed is an additional construction of a pixel separation pattern PP, as shown in the drawing, which may be formed on a portion of the photo diode PD, for example, a surface of the photo diode PD, and which may be selectively driven by an input voltage thus to divide the photo diode PD into the respective unit pixels PD1, PD2, PD3 and PD4 included in the respective unit cells C1, C2, C3 and C4.

In this case, the pixel separation pattern PP may be composed of poly silicon material. The pixel separation pattern PP may include a first pattern 20 extending in a vertical axis of the photo diode PD to divide the same vertically, and a second pattern 30 extending, for example, in a horizontal axis of the photo diode PD to divide the same horizontally.

In a state where the pixel separation pattern PP is placed, when the photo diode PD may be required to be driven by applying an input voltage, for example, positive potential input voltage thereto, an input voltage opposite to the driving voltage of the photo diode PD, i.e., negative potential input voltage may be applied toward the pixel separation pattern PP using an input signal line (not shown) electrically connected with the pixel separation pattern at the same time of the input of the drive voltage of the photo diode PD.

Figure 3:
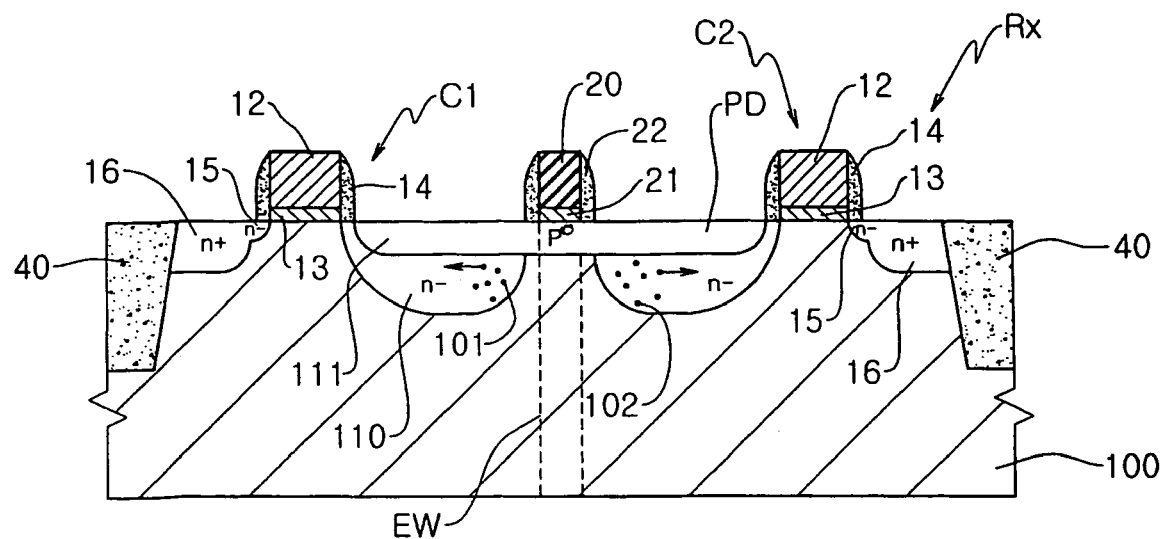
FIG. 3 shows a structural cross-sectional view of the unit cell taken along the line A1-A2 of FIG. 2.

Herein, since the pixel separation pattern PP has been placed adjacent to the surface of the photo diode PD, when successive negative potential voltage may be applied toward the pixel separation pattern PP, as is shown in FIG. 3, electric potential of the photo diode PD adjacent to the pixel separation pattern PP such as a pattern 20 may be raised by the corresponding negative potential voltage, so that an elongated potential partition wall EW extending along a bottom face of the pixel separation pattern 20 may be naturally formed (herein, the reference numerals of FIG. 3 described are explained later).

Figure 4:
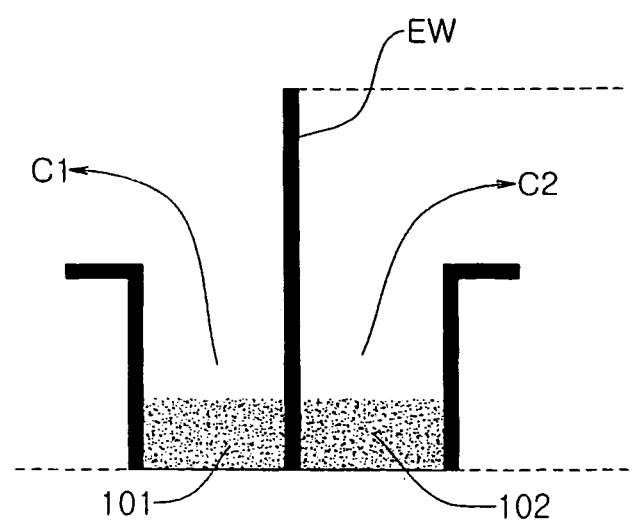
FIG. 4 shows an illustration for explaining an operation of a pixel separation pattern consistent with embodiments of the present invention.

Such partition wall EW may serve to repel electron-hole pairs 101 and 102, respectively generated and stored by, for example, the unit cell C1 or C2 side photo diode PD to each other while maintaining negative potential voltage during driving period of the photo diode PD. As a result, as shown in FIG. 4, at the time when the photo diode PD begins to be entirely driven, the unit cell C1 and C2 side photo diode PD begins to be naturally put in a certain position so that it may be electrically cut off by the partition wall EW. Consequently, the electron-hole pair 101 existing in the unit cell C1 may not moved toward the unit cell C2 adjacent to the unit cell C1, but only in the unit cell C1. Also, the electron-hole pair 102 existing in the unit cell C2 may not moved toward the unit cell C1 adjacent to the unit cell C2, but only in the unit cell C2.

Briefly, when the pixel separation pattern 20 according to the embodiment consistent with the invention is placed on the surface of the photo diode PD and the successive formation operations of the partition wall EW are performed, the photo diode PD can be divided into the respective unit cells C1, C2, C3 and C4, for example, the unit pixels PD1 and PD2 included in the unit cells C1 and C2 without the physical division of the element isolating layer 40.

Under the conventional system, when a process for forming an element isolating layer for physically dividing the respective photo diodes to be formed by the respective unit cells, for example, an etching process, is performed, the semiconductor substrate is typically damaged by mechanical/chemical shocks applied during the corresponding etching process. In this case, when a photo diode is formed on an active region of a semiconductor substrate defined by an element isolating layer without a proper measure, current leakage due to the above damages are typically generated at the interfaces between the element isolating layer and the photo diode.

However, according to embodiments of the present invention, the division of the photo diode PD into the respective unit cells C1, C2, C3 and C4, for example, into the unit cells C1 and C2 may not be performed in a physical manner by the element isolating layer 40 but may be performed in an electrical manner by the pixel separation pattern 20, so that the element isolating layer 40 may be formed only to the extent that, for example, it occupies a circumference of the photo diode PD. As a result, the rate of damage of the semiconductor substrate 100 due to a formation procedure of the element isolating layer 40 may also be minimized naturally, so that current leakage generated at the interfaces between the element isolating layer 40 and the photo diode PD may be restricted to a minimum level.

Meanwhile, as is shown in FIG. 2, in a state where the unit pixels PD1, PD2, PD3 and PD4 of the unit cells C1, C2, C3 and C4 may be individually divided by an electrical operation of the pixel separation pattern PP, the transistors, each included in the corresponding unit pixels PD1, PD2, PD3 and PD4, for example, a reset transistor Rx, a drive transistor Dx, a select transistor Sx and so on may individually reset the unit pixels PD1, PD2, PD3 and PD4, and may individually transfer the electron-hole pairs stored in the corresponding unit pixels PD1, PD2, PD3 and PD4, respectively while each transistor includes the gate electrodes 12, 17 and 18.

In this case, the reset transistors Rx included in the unit cells C1, C2, C3 and C4 can serve to reset the electron-hole pair generated and stored by the unit pixels PD1, PD2, PD3 and PD4 to its initial state. The drive transistors Dx included in the unit cells C1, C2, C3 and C4 serve as a source follower buffer amplifier. Finally, the select transistors Sx included in the unit cells C1, C2, C3 and C4 may serve as a switching device and an addressing device.

Figure 5:
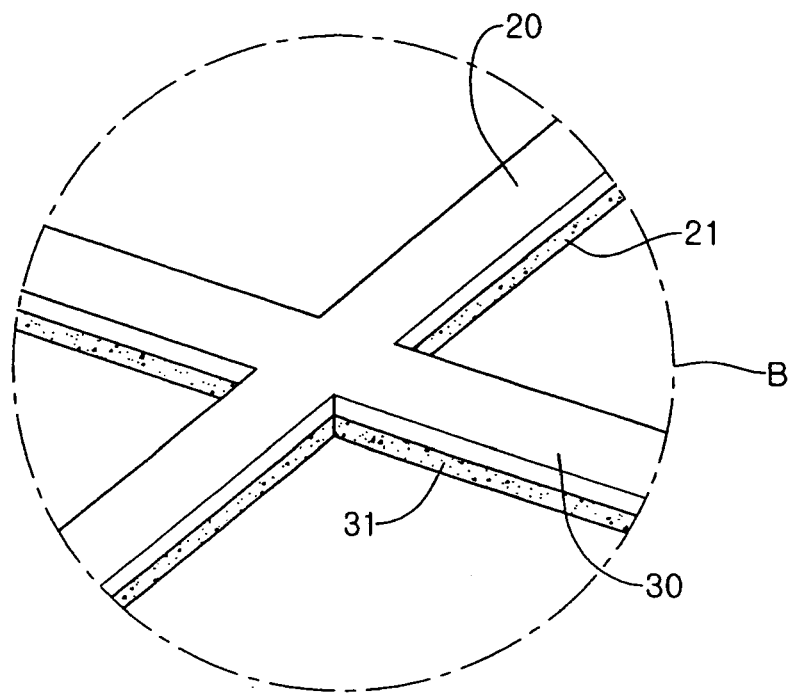
FIGS. 5 and 6 are the illustrations showing layouts of the pixel separation pattern according to the respective embodiments of the present invention.
Figure 6:
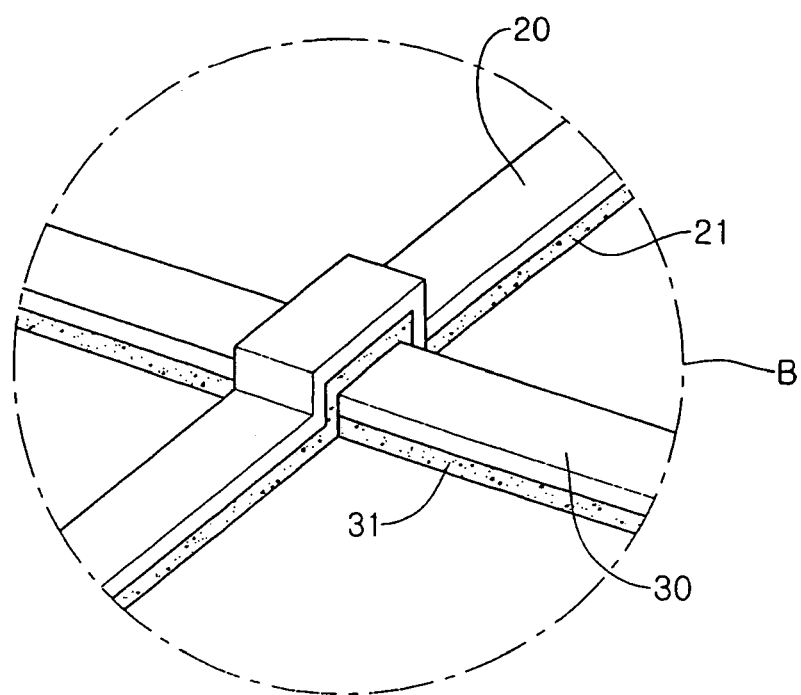

Under the condition, as is mentioned before, the pixel separation pattern PP of the present embodiments may consist of a first pattern 20 for vertically dividing the photo diode PD, and a second pattern 30 for horizontally dividing the photo diode PD. Herein, selectively, the first and second patterns 20 and 30 may be electrically connected with each other as is shown in FIG. 5, or electrically insulated by, for example, interposing an insulating layer 21 of the pixel separation pattern as is shown in FIG. 6 (herein, unexplained numeral 31 represents an insulating layer of the pixel separation pattern for separating the second pattern from the semiconductor substrate).

In this case, for example, when the first and second patterns 20 and 30 are electrically connected with each other, the first and second patterns 20 and 30 may form a single conductive line naturally. In such circumstance, if input voltage is applied to any one of the first and second patterns 20 and 30, the first and second patterns 20 and 30 may form, for example, a cross type potential partition wall, so that the photo diode PD may be concurrently divided into the unit pixels PD1, PD2, PD3 and PD4 included in the unit cells C1, C2, C3 and C4. Consequently, in the finished image sensor, although the number of the input signal lines electrically connected with the pixel separation pattern PP is reduced in minimum level (that is, although any one of the first and second patterns is determined as a signal input terminal), an electrical separation of the unit cells C1, C2, C3 and C4 can be performed normally.

According to an alternative embodiment, when the first and second patterns 20 and 30 are electrically disconnected with each other, the first and second patterns 20 and 30 may form two different conductive lines naturally. In such circumstance, if input voltage is applied to the first and second patterns 20 and 30 (or any one of the first and second patterns), the first and second patterns 20 and 30 can partially divide the photo diode PD vertically or horizontally, or vertically and horizontally through the formation of separate potential partition wall EW. Consequently, the finished image sensor may have an advantage in that the unit pixels PD1, PD2, PD3 and PD4 included in the unit cells C1, C2, C3 and C4 may be selectively integrated or separated depending upon certain circumstances.

Hereinafter, a method for manufacturing an image sensor according to embodiments consistent with the present invention will be described in detail.

A method for manufacturing an image sensor generally comprises forming a plurality of pixels into one group without being separated by an element isolating layer 40 so as to form a photo diode PD on an active region defined on a semiconductor substrate 100, the plural pixels constituting the photo diode; forming a pixel separation pattern PP on the semiconductor substrate 100 for electrically separating the photo diode PD; and forming transistors on the semiconductor substrate 100 so as to control the pixels constituting the photo diode PD electrically separated by the pixel separation pattern PP.

Hereinafter, for ease of explanation, it is assumed that the pixel separation pattern 20 may be representative to all of the pixel separation patterns PP, the respective unit cells C1 and C2 may be representative to all of the unit cells C1, C2, C3 and C4, and a gate electrode 12 of the reset transistor Rx may be representative to all of the gate electrode 12, 17 and 18 of the respective transistors Rx, Dx and Sx.

Figure 7:
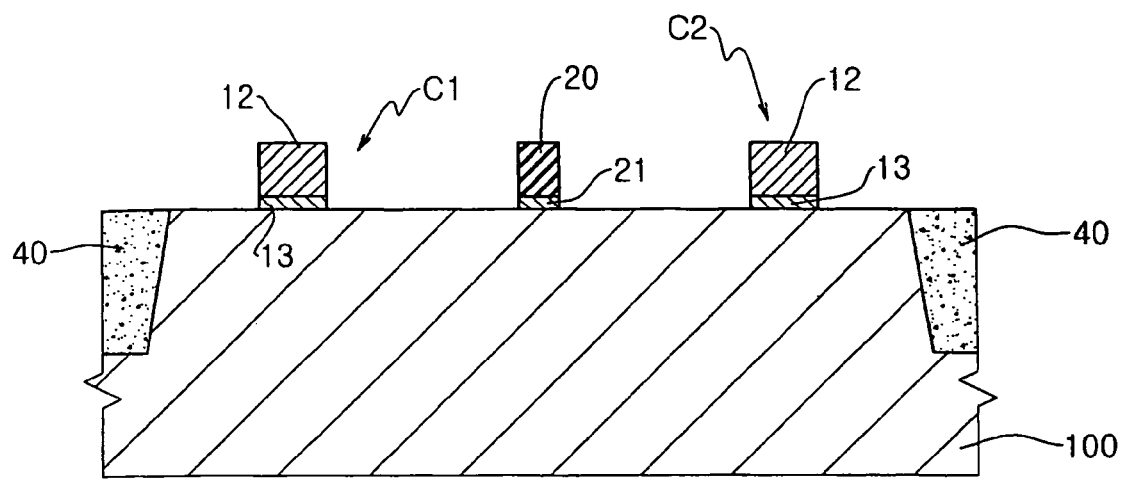
FIGS. 7 to 10 are the process views showing a method for manufacturing an image sensor according to one embodiment of the present invention.

First, as is shown in FIG. 7, an element isolating layer 40 for defining an active region of the semiconductor substrate 100 may be formed by selectively performing a Shallow Trench Isolation (STI) process or a Local Oxidation of Silicon (LOCOS) process, etc. Herein, a P− type epitaxial layer (not shown) for increasing a dimension (or depth) of a depletion region may be formed on the semiconductor substrate 100, for example, the surface of the high concentration P++ type single crystal silicon substrate.

Then, using for example, a low pressure chemical vapor deposition process, an insulating layer of the pixel separation pattern for the pixel separation pattern 20 and an insulating layer of a gate for a gate electrode 12 may be formed in desired thickness on the whole area of the active region including predetermined areas of the photo diode and the transistors by unit cells. In this case, the insulating layers of the pixel separation pattern and the insulating layers of the gate may be composed of a thermal oxide layer formed by, for example, a thermal oxidation process.

Then, using the low pressure chemical vapor deposition process, a conductive layer, for example, high concentration poly crystal silicon layer, for forming the pixel separation pattern and the gate electrode may be formed in a desired thickness on the insulating layers of the pixel separation pattern and the gate. Of course, according to certain circumstances, a silicide layer may be additionally formed on the high concentration poly crystal silicon layer.

Then, by selectively performing a process for removing an unnecessary area through a photolithography using a photoresist pattern PR, a deposition structure of the insulating layer 21 of the pixel separation pattern and the pixel separation pattern 20 may be completed on the predetermined area of the photo diode. At the same time, a deposition structure of the gate insulating layer 13 and the gate electrode 12 may be completed on the predetermined area of the transistors by, such as unit cells C1 and C2. Of course, as is not shown in the drawings, the other gate electrodes 13 and 14 besides the gate electrode 12 may be also formed like such deposition structure.

Herein, since the pixel separation pattern 20 of the present invention may be formed simultaneously with the gate electrode 12, an addition of separate process and a considerable modification of the existing manufacturing process are typically not required.

Figure 8:
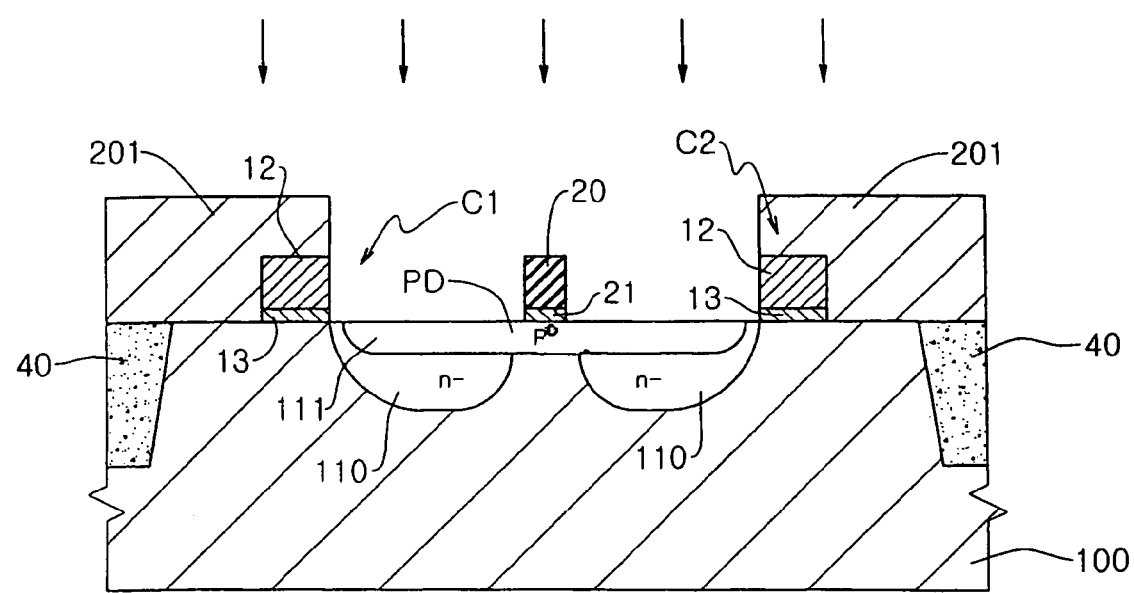

Then, as is shown in FIG. 8, after the photoresist pattern PR for exposing the predetermined area of the photo diode has been formed, using the photoresist pattern PR as a mask for ion implantation, n type impurities may be ion-implanted with low concentration and high energy toward the predetermined area of the photo diode, thus to form an n− type diffusion region 110 on the corresponding area of the photo diode.

Herein, if the n− type diffusion region 110 is formed widely over the whole of the predetermined area, upon a subsequent process for forming the potential partition wall EW through the operation of the pixel separation pattern 20, the semiconductor substrate 100 under the pixel separation pattern 20 may be unnecessarily separated into a P type substrate region and the n− diffusion region 110, possibly causing a problem in that the potential partition wall EW may be hardly formed. In embodiments consistent with the present invention, in consideration of the problem, as is shown in the drawing, the n− diffusion region 110 may be formed to be divided toward the both sides about the pixel separation pattern 20, so that the pixel separation pattern 20 may easily form the potential partition wall EW with no difficulty.

Then, using the photoresist pattern PR as a mask for ion implantation, P type impurities may be ion-implanted with middle concentration and low energy toward the n− diffusion region 110, thus to form a P° type diffusion region 111 on the semiconductor substrate 100 including the n− diffusion region 110. Of course, according to certain circumstances, a process for forming the P° type diffusion region 111 may be abbreviated.

Consequently, when such processes have been completed, as is shown in the drawing, there may have been provided the photo diode PD on the predetermined area thereof including the pixel separation pattern 20, wherein photo diode may be held in common by the unit cells, for example, unit cells C1 and C2, and divided into unit pixels by the pixel separation pattern 20 while being integrated into single large scale pixel.

Figure 9:
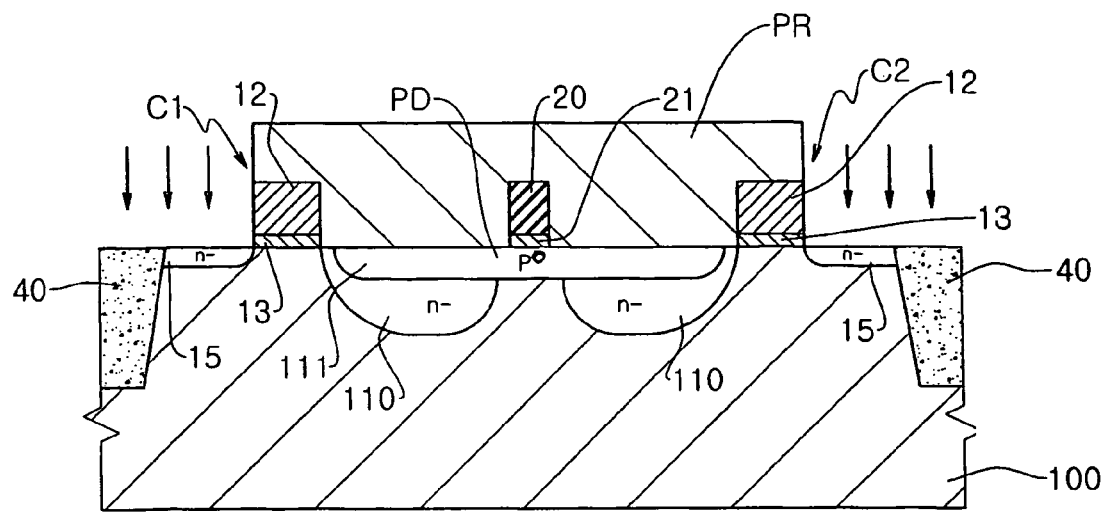
Figure 10:
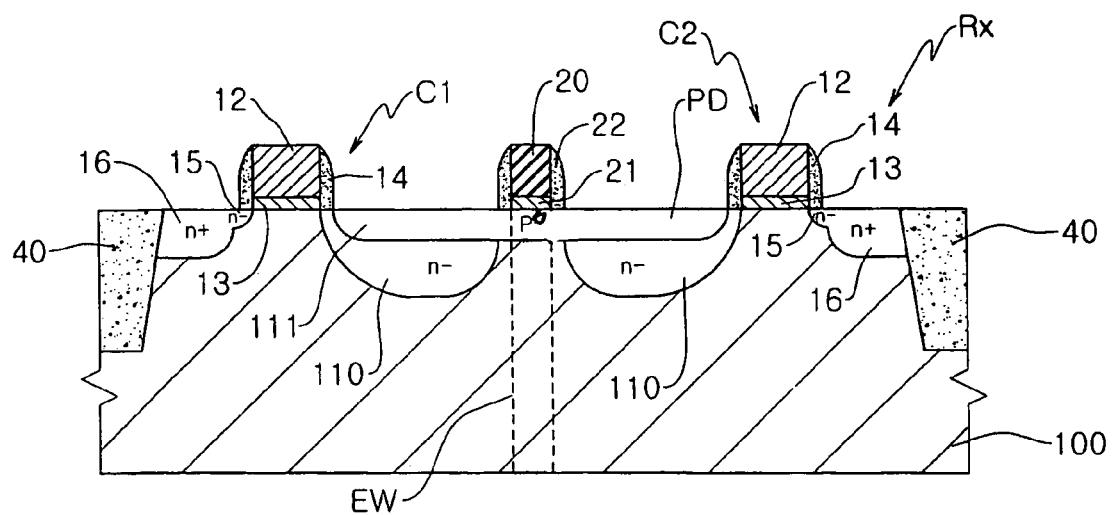

Then, as shown in FIGS. 9 and 10, after the photoresist pattern PR for exposing the predetermined area of the transistors for unit cells have been formed, additional processes including a process for forming an n− diffusion region 15 for lightly doped drain (LDD) structure, and a process for forming the spacers 22 and 14 on the sidewalls of the pixel separation pattern 20 and the gate electrode 12 using an ion implantation of n type low concentration impurities toward one side of the gate electrode, and a process for forming an n+ diffusion region 16 for forming the transistor using an ion implantation of n type high concentration impurities toward one side of the gate electrode 12, may be additionally performed.

Consequently, when such processes have been completed, as is shown in the drawing, the transistors Rx, Dx and Sx have been individually formed on the predetermined area of the transistors for the unit cells, which transistors individually reset the unit pixels PD1, PD2, PD3 and PD4 included in the unit cells C1, C2, C3 and C4, and individually transfer the electron-hole pairs stored in the unit pixels PD1, PD2, PD3 and PD4.

Meanwhile, the method for manufacturing the image sensor of embodiments of the present invention may be modified in various manners according to certain circumstances.

For example, although, as shown in FIGS. 7 to 10, under the afore-mentioned embodiment, the image sensor may be manufactured by forming the pixel separation pattern 20 and the gate electrode 12 and then forming the photo diode PD, the image sensor may be manufactured by forming the photo diode PD and then forming the pixel separation pattern 20 and the gate electrode 12.

Figure 11:
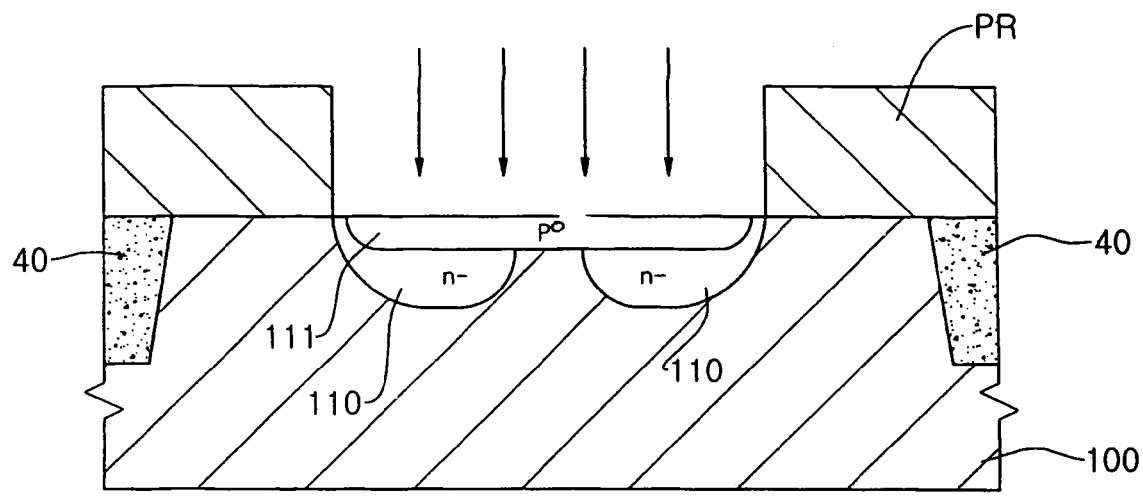
FIGS. 11 to 13 are the process views showing a method for manufacturing an image sensor according to another embodiment of the present invention.
Figure 12:
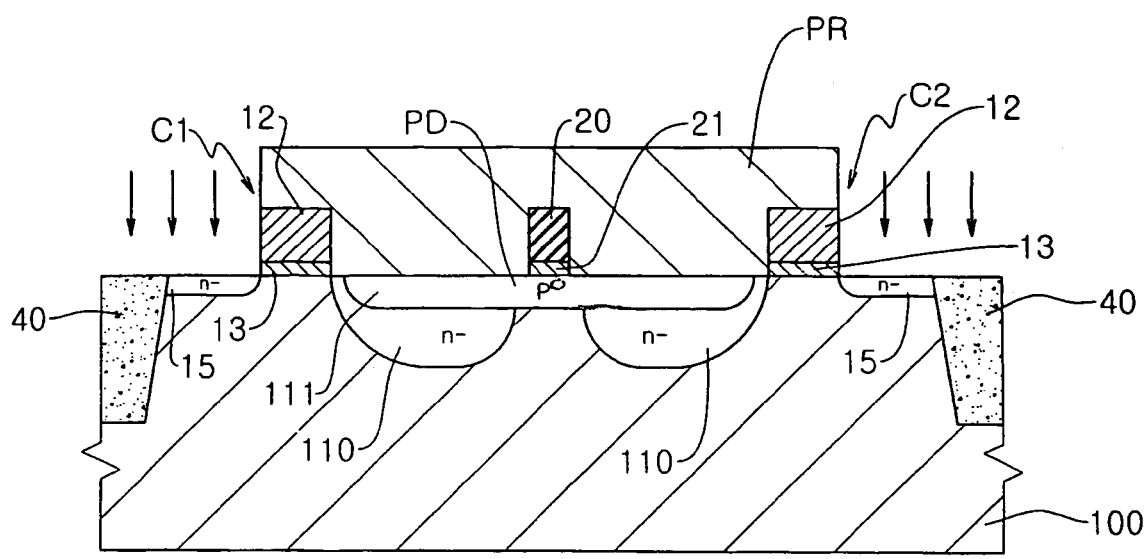
Figure 13:
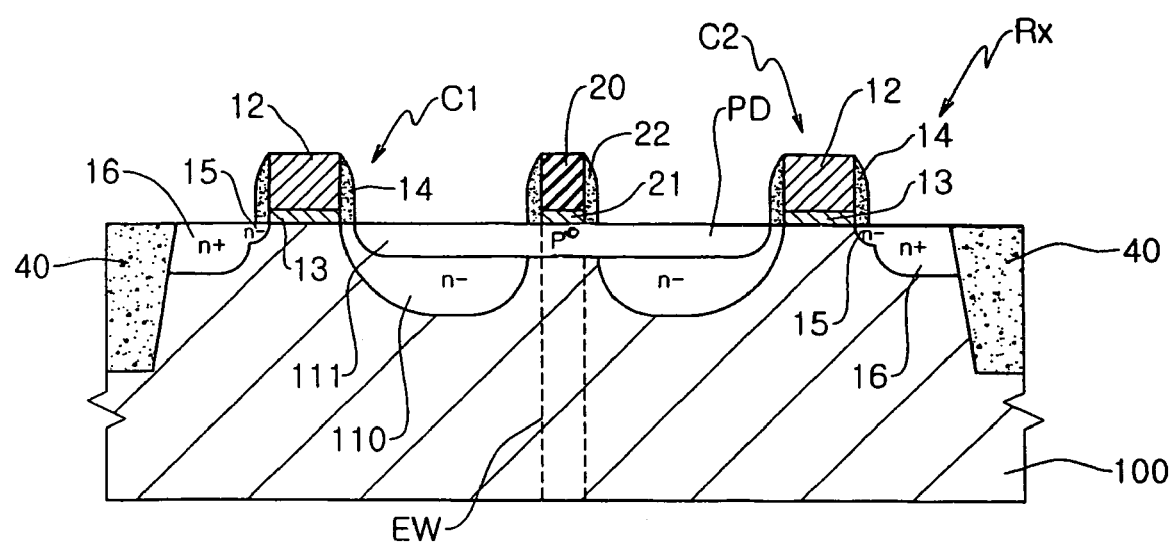

In this case, as shown in FIGS. 11 to 13, the image sensor may be manufactured by forming a photo diode PD integrated into single large scale pixel and held in common by the unit cells C1 and C2, by selectively ion-implanting the low or high concentration impurities to the predetermined area of the photo diode of a semiconductor substrate 100 predefined by an element isolating layer 40; forming a pixel separation pattern 20 for dividing the corresponding photo diode PD into the unit pixels PD1 and PD2 included in the unit cells C1 and C2 on the photo diode PD, and forming the gate electrodes 12 for controlling the movement of the electron-hole pairs stored in the unit pixels PD1 and PD2 on the predetermined area of the transistors for unit cells C1 and C2; and individually forming the transistors Rx, Dx and Sx for individually resetting the unit pixels PD1 and PD2 included in the unit cells C1 and C2, and for individually transferring the electron-hole pairs stored in the corresponding unit pixels PD1 and PD2, by selectively ion-implanting high or low concentration impurities to the predetermined area of the transistors for the unit cells C1 and C2 including the gate electrodes 12.

Of course, the detail of the respective steps may be substantially similar to those of the afore-mentioned embodiments, so an explanation for this will be abbreviated.

According to the afore-mentioned description, embodiments of the present invention may be directed to physically integrate individual photo diodes of the respective unit cells separated by an element isolating layer into a single large scale photo diode with a pixel formed widely on a semiconductor substrate so as to hold the pixel in common, to additionally form a pixel separation pattern on a portion of the large scale photo diode formed like above so as to electrically separate the same, and to naturally secure an optimization of the light receiving area of the photo diode, a minimization of the intrusion area of an element isolating layer and so on, so that the photo diode may recover an area occupied by an intrusion of the element isolating layer, thus maximizing the light receiving area in an optimal scale and easily preventing electrical impacts between the respective unit cells.

Also, an embodiment of the present invention is to improve the quality of a finished CMOS image sensor above a certain level by inducing the maximization of the light receiving area of a photo diode through an improvement of layouts of the photo diodes to greatly increase the fill factor of the corresponding photo diode and thus to increase the quantity of light the photo diode can receive.

Furthermore, embodiments consistent with the present invention improve the quality of a finished CMOS image sensor above a certain level by inducing a minimization of formation of an element isolating layer through an addition of a pixel separation pattern for electrically separating a photo diode integrated into a single large scale pixel to naturally minimize a damaged ratio of a semiconductor substrate caused by a formation of the element isolating layer and thus to restrict a phenomenon of current leakage generated at the interfaces between the element isolating layer and the photo diode at the minimum.

Although embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for manufacturing an image sensor, comprising:
   providing a substrate;
   forming at least one photo diode on the substrate;
   forming at least one pixel separation pattern on the at least one photo diode to separate the at least one photo diode into at least two unit pixels;
   forming transistors to control the at least two unit pixels,
   wherein the pixel separation pattern includes an insulating layer formed on the photo diode and a conductive layer formed on the insulating layer, and
   wherein the photo diode is separated into the at least two unit pixels depending on an input voltage applied to the pixel separation pattern.

2. The method according to claim 1, further comprising performing STI processing and/or LOCOS processing.

3. The method according to claim 1, further comprising forming an element isolating layer to separate the at least one photo diode.

4. The method according to claim 1, wherein forming the pixel separation pattern and transistors, comprises:
   forming the insulating layer and the conductive layer on the substrate sequentially; and
   forming simultaneously the pixel separation pattern and the transistors by etching according to a photolithography process on the substrate.

5. The method according to claim 4, wherein the pixel separation pattern and the transistors are formed of a lamination structure of the insulating layer and the conductive layer.

6. The method according to claim 4, wherein the conductive layer comprises polysilicon.

7. The method according to claim 1, wherein the pixel separation patterns are formed so as to intersect each other.

8. The method according to claim 1, wherein the unit pixels include P$^o$ type diffusion regions and n− diffusion regions, and the P$^o$ type diffusion regions of the unit pixels are connected to each other.

9. The method according to claim 1, wherein the unit pixels include P$^o$ type diffusion regions and n− diffusion regions, and the n− diffusion regions of the unit pixels are separated depending on the location of the pixel separation pattern.

10. The method according to claim 1, wherein the pixel separation patterns include a first pixel separation pattern and a second pixel separation pattern, and wherein the first pixel separation pattern and the second pixel separation pattern are perpendicular to each other.

11. A method for manufacturing an image sensor, comprising:
   providing a substrate;
   predetermining at least one region to form a photo diode on the substrate, and forming at least one pixel separation pattern on the at least one region to section a plurality of unit pixels in the at least one region;
   forming the photo diode in the at least one region; and
   forming transistors to control the photo diode,
   wherein the pixel separation pattern includes an insulating layer formed on the photo diode and a conductive layer formed on the insulating layer, and
   wherein the photo diode is separated into the at least two unit pixels depending on an input voltage applied to the pixel separation pattern.

12. The method according to claim 11, further comprising performing STI processing and/or LOCOS processing.

13. The method according to claim 11, further comprising forming an element isolating layer to separate the photo diode from other photo diodes.

14. The method according to claim 13, wherein the pixel separation patterns are formed so as to intersect each other.

15. The method according to claim 11, wherein forming the pixel separation pattern and transistors comprises:
   forming the insulating layer and the conductive layer on the substrate sequentially; and
   forming simultaneously the pixel separation pattern and the transistors by etching according to a photolithography process on the substrate.

16. The method according to claim 15, wherein the pixel separation pattern and the transistors are formed of a lamination structure of the insulating layer and the conductive layer.

17. The method according to claim 15, wherein the conductive layer comprises polysilicon.

18. The method according to claim 11, wherein the unit pixels include $P^o$ type diffusion regions and n− diffusion regions, and the $P^o$ type diffusion regions of the unit pixels are connected to each other.

19. The method according to claim 11, wherein the unit pixels include $P^o$ type diffusion regions and n− diffusion regions, and the n− diffusion regions of the unit pixels are separated depending on the location of the pixel separation pattern.

20. The method according to claim 11, wherein the pixel separation patterns include a first pixel separation pattern and a second pixel separation pattern, and wherein the first pixel separation pattern and the second pixel separation pattern are perpendicular to each other.

* * * * *